(12) United States Patent
Ng

(10) Patent No.: US 6,813,578 B1
(45) Date of Patent: Nov. 2, 2004

(54) PROCESS FOR MEASURING CMOS DEVICE PERFORMANCE FROM HOT CARRIER LUMINESCENCE

(75) Inventor: William Ng, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/364,052

(22) Filed: Feb. 10, 2003

(51) Int. Cl.[7] .......................... G01R 27/28; G01R 31/00
(52) U.S. Cl. .................. 702/117; 324/519; 324/537
(58) Field of Search ........................... 702/57, 79, 81, 702/82–84, 108, 117, 118, 121, 124–126, 176; 329/519, 527, 537, 750, 751–753, 765; 438/16

(56) References Cited

U.S. PATENT DOCUMENTS 6,596,980 B2 * 7/2003 Rusu et al. .............. 250/214.1

OTHER PUBLICATIONS

W. Ng et al., "Hot Carrier Luminescence for Backside 0.15μm CMOS Device Analysis," 4 pages in length.
J.C. Tsang et al., "Picosecond imaging circuit analysis," *IBM J. Res. Develop.*, vol. 44, No. 4, Jul. 2000, pp. 583–603.
M. McManus et al., "Picosecond Imaging Circuit Analysis of the IBM G6 Microprocessor Cache," *Proceedings of the 25th International Symposium for Testing and Failure Analysis*, Santa Clara, California, Nov. 14–18, 1999, pp. 35–38.
F. Stellari et al., "Tools for Non–Invasive Optical Characterization of CMOS Circuits," *IEDM*, 1999, 4 pages in length.
N. Goldblatt et al., "Unique and Practical IC Timing Analysis Tool Utilizing Intrinsic Photon Emission," *Micro. Ref.*, vol. 41, 2001, 6 pages in length.
M. Bruce et al., "Single Point PICA Probing with an Avalanche Photo–Diode," *Proceeding from the 27th International Symposium for Testing and Failure Analysis*, 2001, 7 pages in length.
J.C. Tsang et al., "Picosecond hot electron light emission from submicron complementary metal–oxide–semiconductor circuits," *Appl. Phys. Lett.*, vol. 70, No. 7, Feb. 17, 1997, pp. 889–891.

* cited by examiner

Primary Examiner—Marc S. Hoff
Assistant Examiner—Manuel L Barbee
(74) Attorney, Agent, or Firm—Stallman & Pollock LLP

(57) ABSTRACT

The present invention is a process for measuring semiconductor device output capacitance and slew rate from switching-induced hot carrier luminescence. The process for determining the output capacitive loading of a semiconductor device includes measuring the peak switching-induced hot carrier luminescence and comparing it to previously correlated capacitance data. The process for determining the output slew rate of a semiconductor device by measuring the switching-induced hot carrier luminescence as a function of time, calculating a standard deviation of the luminescence data, and comparing it to previously correlated output slew rate data. The peak of a switching-induced hot carrier luminescence pulse directly relates to the driving capacitance and the standard deviation of a pulse relates to the rate of change of output voltage or slew rate.

15 Claims, 3 Drawing Sheets

PROCESS FOR MEASURING CMOS DEVICE PERFORMANCE FROM HOT CARRIER LUMINESCENCE

BACKGROUND OF THE INVENTION

1. Field of the Invention

This invention relates generally to a process for testing semiconductor devices, and relates more particularly to a process for measuring CMOS device output capacitance and output slew rate from switching-induced hot carrier luminescence.

2. Description of the Relevant Art

Measuring switching-induced hot carrier luminescence from semiconductor transistors such as CMOS devices is a passive, noninvasive optical method for monitoring device operation. It is sometimes referred to as Pico-second Imaging Circuit Analysis (PICA). When current flows through a switching CMOS device, the supply voltage accelerates electrons, which in turn causes photon emission in the near infrared region. The light is emitted close to the drain where the electric field is the most intense. Typically, more photons are generated from an nMOSFET device than a pMOSFET device, since carrier mobility is higher in an nMOSFET.

This technique allows monitoring of individual semiconductor devices. The front side of a typical integrated circuit is covered with metallization layers that may obscure the semiconductor devices and the metal interconnections that carry the electrical signals, so that the semiconductor devices and many of the signal-carrying metal lines may not be accessible to external probes for testing. Furthermore, flip-chip packaging orients the top side of an integrated circuit downward in the package, which further complicates access to individual semiconductor devices or signal lines for testing.

The PICA technique, however, overcomes these limitations because the switching-induced hot carrier photons can be detected from the back side of the integrated circuit. Silicon is transparent to light at the near infrared wavelengths of the hot carrier photons, so some of the emitted photons emerge from the back side of the integrated circuit where they can be detected. Thus, the method of detecting intrinsic photon emission from switching devices through the device backside provides superior circuit observability.

The PICA technique uses optics to image the emitted photons onto a photodetector. The switching-induced hot carrier luminescence emits photons only during switching, but not every switching event generates a photon and not every photon is detected. Consequently, the device must be cycled on and off and the photons collected over extended periods, like several minutes. When the detected photons are time-correlated and integrated, timing analysis is possible to pico-second accuracy.

The collection of timing data during device switching in the pico-second realm has been the primary use of this intrinsic luminescence. Switching-induced hot carrier luminescence can be used to measure internal device timing at pico-second accuracy. This is a time-correlated photon counting technique in which a single photon detector is synchronized with device test stimulus. Time-resolved photon measurements were obtained through time integration of photon counting.

What is needed, however, is the ability to measure more than the timing of a device. It would be beneficial to be able to measure other parameters such as output capacitance and output slew rate.

SUMMARY OF THE INVENTION

In summary, the present invention is a process for measuring semiconductor device output capacitance and slew rate from switching-induced hot carrier luminescence. CMOS devices are the preferred semiconductor devices to be measured with the present invention.

The present invention includes a process for determining the output capacitive loading of a semiconductor device by measuring the peak switching-induced hot carrier luminescence and comparing it to previously correlated capacitance data. In particular, the process includes preliminary steps of analyzing a process test device to determine its node capacitances, applying a driving signal to the process test device and detecting its peak switching-induced hot carrier luminescence, and correlating the node capacitances and the detected peak luminescence to establish a correlation between output capacitive loading and peak luminescence. The process further includes applying a driving signal to the semiconductor device under test and detecting its peak switching-induced hot carrier luminescence, and determining the output capacitive loading of the semiconductor device by using the correlation between output capacitive loading and peak luminescence. The process test device is a test circuit that is made by the same or a similar process as the semiconductor device and that has known or measurable parasitics so that its RC characteristics can be extracted and used to establish the correlation.

The present invention also includes a process for determining the output slew rate of a semiconductor device by measuring the switching-induced hot carrier luminescence as a function of time, calculating a standard deviation of the luminescence data, and comparing it to previously correlated output slew rate data. In particular, the process includes preliminary steps of analyzing a process test device to determine output slew rates thereof, applying a driving signal to the process test device and detecting its switching-induced hot carrier luminescence as a function of time, fitting the detected luminescence of the process test device to a Gaussian curve and determining its standard deviation, and correlating the output slew rates and the standard deviation of the luminescence of the process test device to establish a correlation between the two. The process further includes applying a driving signal to the semiconductor device under test and detecting its switching-induced hot carrier luminescence as a function of time, fitting the detected luminescence of the semiconductor device to a Gaussian curve and determining a standard deviation thereof, and determining the output slew rate of the semiconductor device by using the correlation between output slew rate and the standard deviation of the detected luminescence.

In summary, the peak of a switching-induced hot carrier luminescence pulse directly relates to the driving capacitance and the standard deviation of a pulse relates to the rate of change of output voltage or slew rate.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENTS

The drawings depict various preferred embodiments of the present invention for purposes of illustration only. One skilled in the art will readily recognize from the following discussion that alternative embodiments of the structures and methods illustrated herein may be employed without departing from the principles of the invention described herein.

Data collected using a National Semiconductor CMOS 10$i$ process test device (LC10iQEVB) shows that intrinsic hot carrier luminescence can be used to correlate other device parameters such as output capacitive loading and dynamic power consumption or output slew rate. This is a new application of device hot carrier luminescence to perform silicon device characterization other than previously reported timing analysis.

The core of this invention is based on the fact that substrate current ($I_{sub}$) of a MOSFET device under an AC driving signal is affected by the impact ionization current ($I_{ion}$) and displacement current ($I_{dis}$). Displacement current, $I_{dis}$, is the product of output slew rate and effective driving capacitance, and is typically written as C*dv/dt, where C is the effective capacitance and dv/dt is the time derivative of voltage at the electrical node of interest. Since the generation of hot carrier luminescence is closely related to $I_{sub}$ and, for fast switching CMOS circuits, the contribution of $I_{dis}$ to the total $I_{sub}$ is big (i.e., $I_{ion}$ is comparatively small), the determination of $I_{dis}$ will provide an estimation of dynamic power consumption. This invention primarily deals with obtaining capacitance (C) as well as output falling slew rate (dv/dt) using device hot carrier luminescence from switching-induced CMOS devices.

Figure 1A:
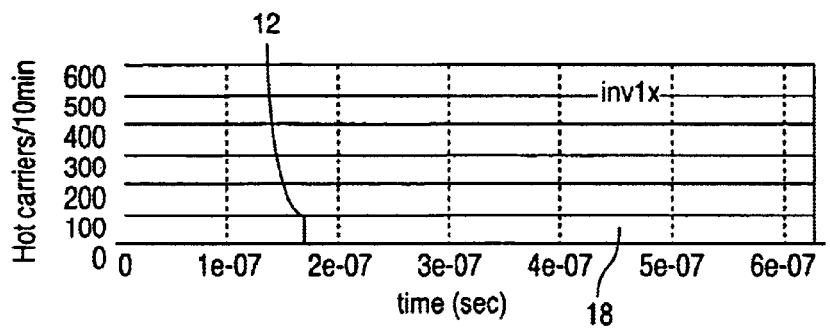
FIGS. 1a, 1b, and 1c are graphs of hot carrier luminescence versus time for three different inverters.
Figure 1B:
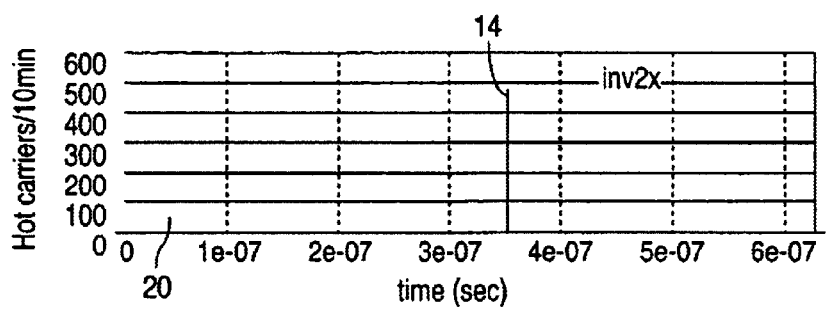
Figure 1C:
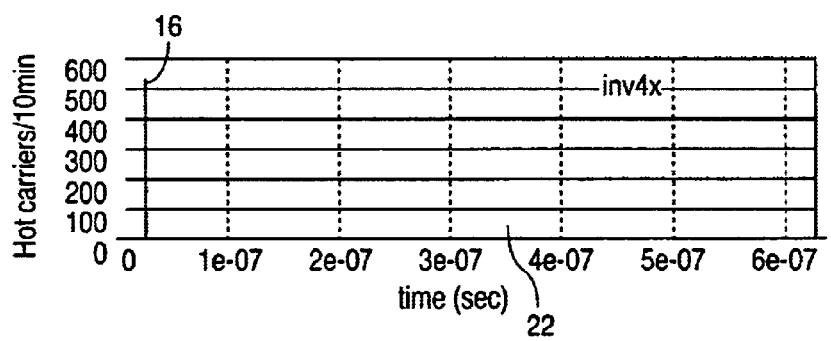
Figure 2:
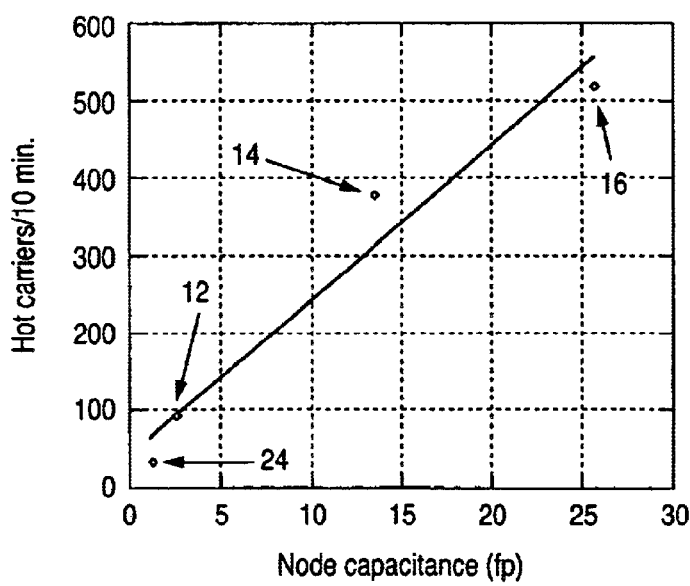
FIG. 2 is a graph of hot carrier luminescence versus node capacitance according to the present invention.

As shown in FIGS. 1 and 2, logic gates driving bigger capacitive loads on a process test device exhibit higher detected photon emission peaks. The data was collected from several inverter gates having different drive strengths and which drove proportionally sized dummy capacitive loads attached at the outputs to mimic real life application.

FIG. 1 (FIGS. 1a, 1b, and 1c, collectively) shows plots of photon emission pulses from different inverter gates driving various loads at a supply voltage of 1.8 V. It is evident that higher photon detection rates were observed for the gates bearing bigger output capacitive loads. In FIG. 1a, a 1× sized inverter exhibited a peak luminescence at point 12 when the nMOSFET switched. In FIG. 1b, a 2× sized inverter had a higher peak 14, whereas in FIG. 1c, a 4× sized inverter had an even higher peak 16. These figures also show the peak switching-induced luminescence 18, 20, and 22 for the pMOSFET devices, but these are much smaller than the nMOSFET peak luminescence 12, 14, and 16. The y-axis has units of hot carriers (photons) detected in a period of ten minutes. The x-axis has units of time, but since the inverters were daisy-chained together the devices switched on and off at different times. Because all inverters were driven with the same 1.6 MHz input signal for the same duration, the same number of transitions occurred at each node during photon detection for all inverters. Consequently, the difference in size of emission pulses in FIG. 1 is related to the capacitive loads that the inverter devices were driving, not input stimulus.

The presence of current flow through CMOS devices during switching is a necessary condition for luminescence. Devices with bigger capacitive loads result in higher displacement current discharging into the nMOSFET; hence, more photons are generated and detected. Furthermore, the displacement current is related to the effective driving capacitance times the output falling slew rate. Since SPICE simulations only showed a small variation of output slew rate among the inverter types, the size of the driving capacitance is believed to be the main contributor to the difference in the heights of the emission peaks (detected luminescence) in FIG. 1. As a result, it is possible to empirically establish a relationship between the sizes of the output capacitive loads and emission peaks on the process test device.

In FIG. 2, the variation of the size of the capacitive load to photon detection rate is shown. The y-axis is switching-induced hot carrier luminescence detected over a 10 minute period, while the x-axis is node capacitance. The node capacitance was derived from a post-layout analysis of RC characteristics of the test devices. Points 12, 14, and 16 are the same as those shown in FIG. 1 for the 1×, 2×, and 4× inverters, respectively. Point 24 is the luminescence measured for a NAND gate that has negligible output capacitance. The limited data plotted in FIG. 2 suggests a linear relationship between luminescence and capacitance, although the relationship may be logarithmic, exponential, asymptotic, monotonic, or another function. It is expected that the slope of the function decreases with increasing capacitance. The present invention is not limited to any particular functional relationship between luminescence and capacitance, but rather depends on correlating actual data to determine the actual relationship for a particular process.

Figure 3:
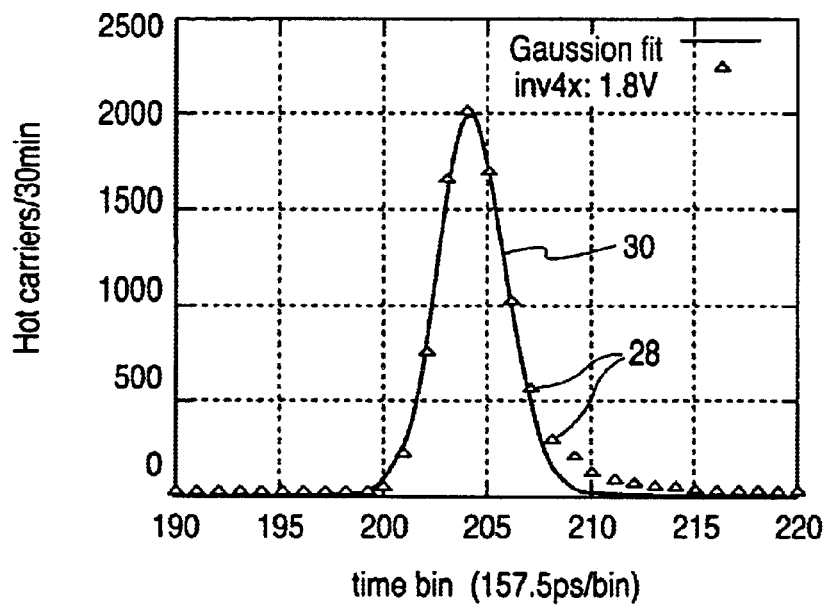
FIG. 3 is a graph of hot carrier luminescence versus time for one inverter with a Gaussian profile superimposed according to the present invention.
Figure 4:
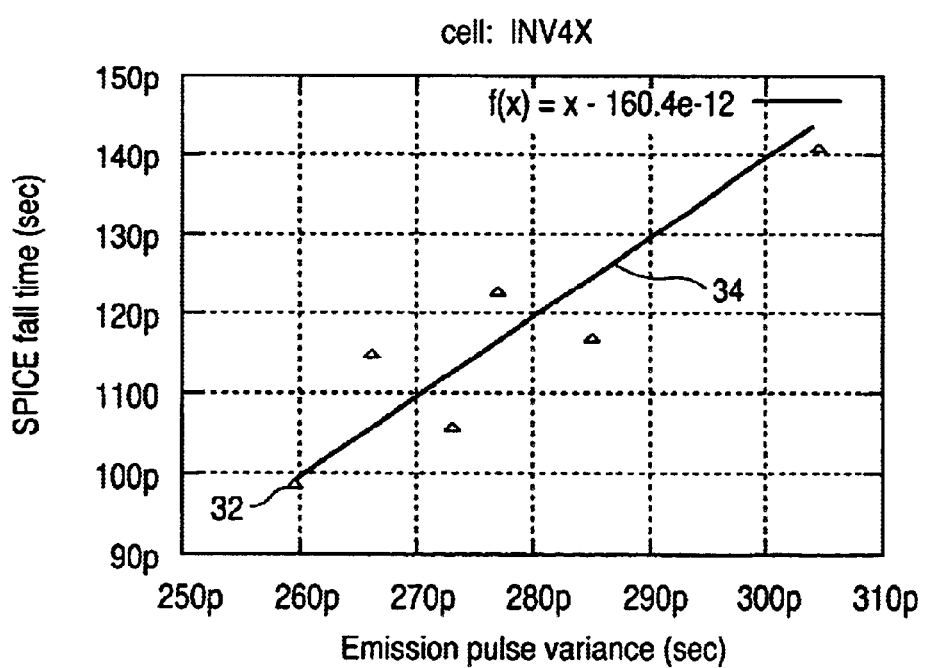
FIG. 4 is a graph of fall time versus emission pulse variance or standard deviation according to the present invention.

Another aspect of the present invention, that of using switching-induced hot carrier luminescence to determine output slew rate, is illustrated in FIGS. 3 and 4. To establish correlation of the device fall times to switching-induced intrinsic luminescence, the supply voltage to the test device was varied and luminescence data was collected at each voltage setting for the inverter gates. The resulting emission pulses were Gaussian fitted to obtain the variances (σ), which is then plotted against fall times. FIG. 3 shows an example of the Gaussian fit result and FIG. 4 shows the plot of variance (standard deviation) versus the inverter gate fall times.

In particular, FIG. 3 is a plot of luminescence data 28 obtained from the 4× inverter on the test process device measured over thirty minutes with a supply voltage of 1.8 volts. The data was then fitted to a Gaussian curve 30, $G(x)=A*\exp\{-\frac{1}{2}*[(x-u)/v]**2\}$, where A, u and v are the peak, mean and variance (standard deviation) of the Gaussian function, respectively. A standard deviation of about 260 picosec was obtained (1.65 time bin units ×157.5 picoseconds/bin). Similar data was collected over a range of supply voltages and standard deviations were determined.

FIG. 4 is a graph of the standard deviations or variances of the best-fit Gaussian curves for the 4× inverter plotted against simulated fall time as computed from a SPICE simulation. The simulation was done using a post-layout netlist with extracted RC parasitics. FIG. 4 shows the relationship of the curve—fitted variance or standard deviation vs. SPICE simulated fall time. Point 32 is the result from the Gaussian curve 30 of FIG. 3. A best-fit straight line 34 is drawn through the data. The limited data plotted in FIG. 4 suggests a linear relationship between variance and fall time, although the relationship may be logarithmic, exponential, asymptotic, monotonic, or another function. The present invention is not limited to any particular functional relationship between variance and fall time, but rather depends on correlating actual data to determine the actual relationship for a particular process.

It is believed that the statistically obtained photon emission pulses relate to the rate of change of the output voltages. A faster switching output produces a narrower emission pulse resulting in a smaller standard deviation.

Notice that the luminescence data 28 on the right side of the peak in FIG. 3 is higher than the Gaussian curve 30. Two explanations have been proposed—either electrons 'straggle' across the channel or a change in drain-source voltage occurs as the transistor state evolves.

While the emission peak height at constant supply voltage is directly related to the number of transitions, the width of the pulse is due to the transit time spread (TTS) or jitter of the detector and electronics (i.e. the jitter of the stimulus and the device itself), and the fall time ($T_{fall}$) of the MOSFET device. Statistically, these components add in quadratures as $(K^2+T_{fall}^2)^{1/2}$ where K is the total system TTS. As long as K is fixed, a monotonic relationship between variance or standard deviation and $T_{fall}$ is expected.

Figure 5:
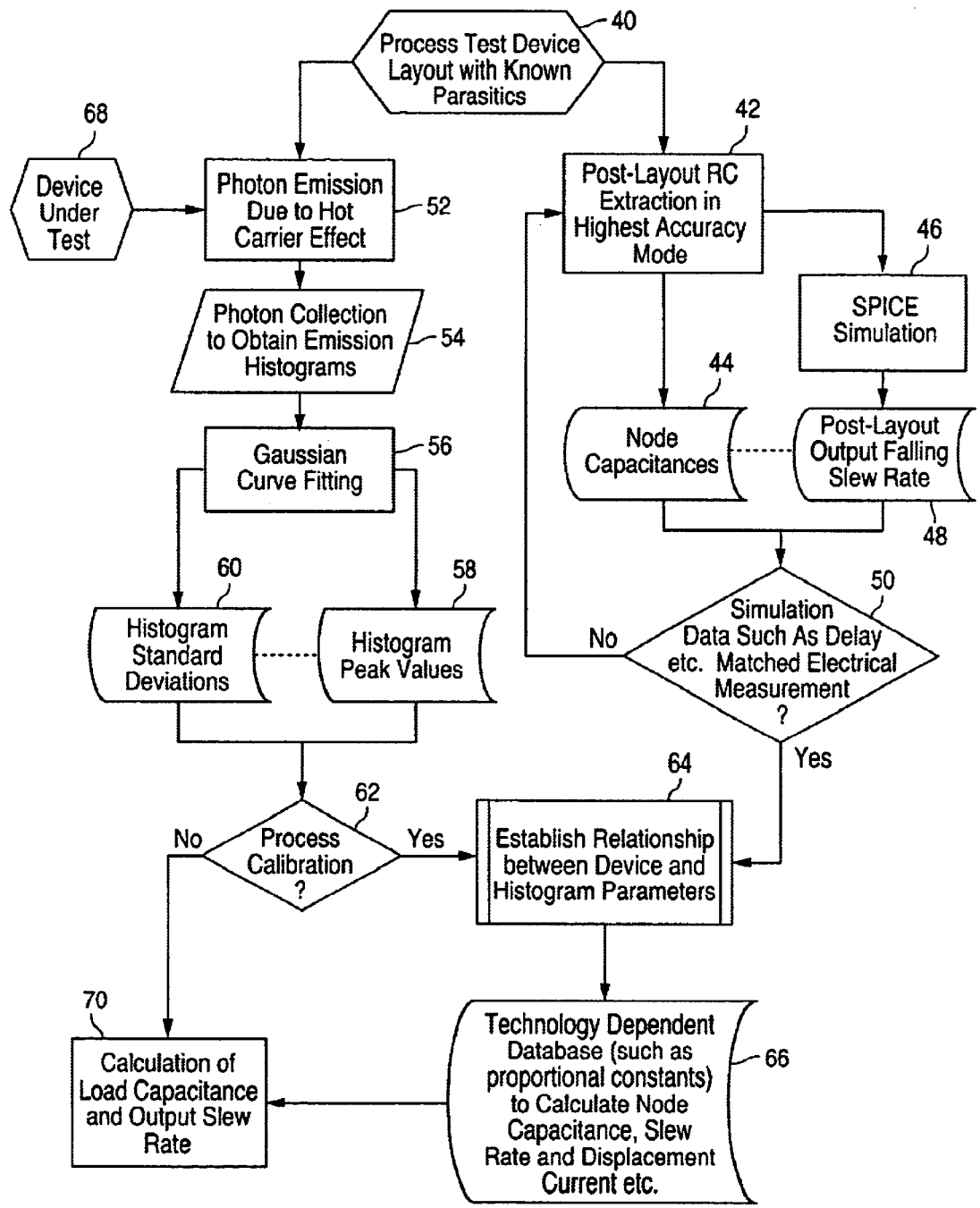
FIG. 5 is a flow chart of a process for determining output capacitive loading and output slew rate according to the present invention.

FIG. 5 is a flow chart that depicts a process of using a process test device to establish relationships between switching-induced hot carrier luminescence and device parameters, including capacitance and output slew rates. The relationships established will be technology process dependent, but subsequent devices from the same process can use the information to obtain their respective driving capacitances and output slew rates and therefore dynamic power consumption from the calculation of $I_{dis}$.

The process illustrated in FIG. 5 begins with a process test device layout with known parasitics, at step 40. Proceeding on the right side of the flow chart, the layout of the process test device is subjected to a post-layout RC extraction using the highest accuracy mode at step 42. From that information, the node capacitances (step 44) can be obtained. The RC extraction data is input to a SPICE simulation (step 46) and the slew rate information is obtained (step 48). The data resulting from the simulation is checked with measured data at step 50 to confirm the accuracy of the simulation. If acceptable, the process proceeds, if not, the RC extraction and simulation are repeated.

In order to establish the correlations between luminescence and capacitance and slew rate performance, luminescence data is collected from the process test device on the left side of the flow chart. Steps 52 and 54 represent gathering the switching-induced hot carrier luminescence data by the process described above. The process test device is driven by a signal, preferably a 50% duty cycle square wave, and the emitted photons are detected over an extended period of time. In step 56, the histograms of the collected luminescence data are fitted to Gaussian curves. From that, the peak values and standard deviations are determined in steps 58 and 60. Since the process is being calibrated at this point, step 62 directs the flow to step 64, where the correlations between luminescence and capacitance, on one hand, and between luminescence and standard deviation, on the other hand, are established. The result of the calibration is step 66, a database of capacitance, slew rate, and other parameters for the fabrication process used.

When a semiconductor device is to be tested, one begins the flow chart at step 68. In steps 52 and 54, the semiconductor device under test is driven with the same driving signal for the same length of time as the process test device and the switching-induced hot carrier luminescence data is obtained. In step 56, the histograms of the collected luminescence data are fitted to Gaussian curves. From that, the peak values and standard deviations are determined in steps 58 and 60. Since the process has been previously calibrated, the next step is step 70 to calculate the output capacitance and output slew rates by comparing the measured luminescence data (peak value and standard deviation from a Gaussian curve) to the correlations obtained in the calibration steps. The results are the output capacitive loading and output slew rates as determined by the present invention.

From the above description, it will be apparent that the invention disclosed herein provides a novel and advantageous process for measuring semiconductor device output capacitance and output slew rate from switching-induced hot carrier luminescence. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting of the scope of the invention, which is set forth in the following claims.

What is claimed is:

1. A process for determining output capacitive loading of a semiconductor device, said process comprising:
   analyzing a process test device to determine node capacitances thereof;
   applying a driving signal to the process test device and detecting peak switching-induced hot carrier luminescence thereof;
   correlating the node capacitances of the process test device and the detected peak luminescence of the process test device to establish a correlation between output capacitive loading and peak luminescence;
   applying a driving signal to the semiconductor device and detecting peak switching-induced hot carrier luminescence thereof; and
   determining the output capacitive loading of the semiconductor device by using the correlation between output capacitive loading and peak luminescence.

2. A process as recited in claim 1 wherein the step of analyzing the process test device to determine node capacitances includes a step of using post-layout RC extraction to determine node capacitances.

3. A process as recited in claim 1 wherein the semiconductor device and the process test device are made according to the same fabrication processes.

4. A process as recited in claim 1 wherein the semiconductor device and the process test device are CMOS devices.

5. A process as recited in claim 1 wherein the driving signal is a square wave and wherein the steps of applying a driving signal and detecting luminescence occur over a period of time.

6. A process as recited in claim 1 wherein the step of correlating includes finding a function that best fits the relationship between the node capacitances and the detected peak luminescence.

7. A process as recited in claim 6 wherein the step of using the correlation to determine the output capacitive loading includes applying the function to the peak luminescence detected for the semiconductor device.

8. A process for determining output slew rate of a semiconductor device, said process comprising:

analyzing a process test device to determine output slew rates thereof;

applying a driving signal to the process test device and detecting switching-induced hot carrier luminescence as a function of time thereof;

fitting the detected luminescence of the process test device to a Gaussian curve and determining a standard deviation thereof;

correlating the output slew rates of the process test device and the standard deviation of the detected luminescence of the process test device to establish a correlation between output slew rates and the standard deviation of the detected luminescence;

applying a driving signal to the semiconductor device and detecting switching-induced hot carrier luminescence thereof;

fitting the detected luminescence of the semiconductor device to a Gaussian curve and determining a standard deviation thereof; and determining the output slew rate of the semiconductor device by using the correlation between output slew rate and the standard deviation of the detected luminescence.

9. A process as recited in claim 8 wherein the step of analyzing the process test device to determine output slew rates includes a step of using post-layout RC extraction and node capacitances to determine output slew rates.

10. A process as recited in claim 8 wherein the semiconductor device and the process test device are made according to the same fabrication processes.

11. A process as recited in claim 8 wherein the semiconductor device and the process test device are CMOS devices.

12. A process as recited in claim 8 wherein the driving signal is a square wave and wherein the steps of applying a driving signal and detecting luminescence occur over a period of time.

13. A process as recited in claim 8 wherein the step of correlating includes finding a function that best fits the relationship between the output slew rates and the standard deviation of the detected luminescence.

14. A process as recited in claim 13 wherein the step of using the correlation to determine the output slew rate includes applying the function to the standard deviation of the luminescence detected for the semiconductor device.

15. A process for determining output capacitive loading and output slew rate of a CMOS device, said process comprising:

analyzing a process test device to determine node capacitances and output slew rates thereof;

applying a driving signal to the process test device and detecting switching-induced hot carrier luminescence thereof;

determining a peak value of the detected luminescence of the process test device;

fitting the detected luminescence of the process test device to a Gaussian curve and determining a standard deviation thereof;

correlating the node capacitances of the process test device and the peak luminescence of the process test device to establish a first correlation between output capacitive loading and peak luminescence;

correlating the output slew rates of the process test device and the standard deviation of the detected luminescence of the process test device to establish a second correlation between output slew rates and the standard deviation of the detected luminescence;

applying a driving signal to the CMOS device and detecting switching-induced hot carrier luminescence thereof;

determining the output capacitive loading of the CMOS device by using the first correlation between output capacitive loading and peak luminescence;

fitting the detected luminescence of the CMOS device to a Gaussian curve and determining a standard deviation thereof; and determining the output slew rate of the CMOS device by using the second correlation between output slew rate and the standard deviation of the detected luminescence.

* * * * *